(12) United States Patent
Zhai et al.

(10) Patent No.: US 7,804,103 B1
(45) Date of Patent: Sep. 28, 2010

(54) WHITE LIGHTING DEVICE HAVING SHORT WAVELENGTH SEMICONDUCTOR DIE AND TRICHROMATIC WAVELENGTH CONVERSION LAYERS

(75) Inventors: Jinhui Zhai, Oldsmar, FL (US); Israel Morejon, Tampa, FL (US); Thong Bui, Tarpon Springs, FL (US)

(73) Assignee: LEDnovation, Inc., Tampa, FL (US)

( * ) Notice: Subject to any disclaimer, the term of this patent is extended or adjusted under 35 U.S.C. 154(b) by 3 days.

(21) Appl. No.: 12/349,880

(22) Filed: Jan. 7, 2009

(51) Int. Cl.
*H01L 33/00* (2010.01)

(52) U.S. Cl. .............................. 257/98; 257/79; 257/88; 257/89; 257/99

(58) Field of Classification Search .................... 257/98, 257/79, 88, 89, 99
See application file for complete search history.

(56) References Cited

U.S. PATENT DOCUMENTS

| | | | |
|---|---|---|---|
| 7,259,400 B1 | 8/2007 | Taskar | |
| 7,374,807 B2 | 5/2008 | Parce et al. | |
| 7,380,962 B2 | 6/2008 | Chaves et al. | |
| 7,390,684 B2 | 6/2008 | Izuno et al. | |
| 2007/0284601 A1 | 12/2007 | Khanarian | |
| 2007/0290218 A1 | 12/2007 | Andrews et al. | |
| 2008/0001538 A1 | 1/2008 | Cok | |
| 2008/0113214 A1 | 5/2008 | Davis et al. | |
| 2008/0231170 A1* | 9/2008 | Masato et al. ............... | 313/501 |

* cited by examiner

*Primary Examiner*—Long Pham
(74) *Attorney, Agent, or Firm*—Ronald E. Smith; Smith & Hopen, P.A.

(57) ABSTRACT

A high color rendering index (CRI) white light emitting device from a short wavelength semiconductor die is encapsulated with nanoparticle-loaded resin. Trichromatic wavelength conversion micro-particles are dispersed layer by layer in a converting sequence from a long emission spectrum to a short emission spectrum. The refractive index of wavelength conversion micro-particles matches that of the nanoparticle-loaded encapsulants.

6 Claims, 2 Drawing Sheets

WHITE LIGHTING DEVICE HAVING SHORT WAVELENGTH SEMICONDUCTOR DIE AND TRICHROMATIC WAVELENGTH CONVERSION LAYERS

FIELD OF THE INVENTION

This invention relates, generally, to semiconductor lighting devices and to related components, systems and methods. More particularly, it relates to a method of making warm white light by using a short wavelength semiconductor die with trichromatic wavelength conversion layers.

DESCRIPTION OF THE PRIOR ART

Known semiconductor light emitting devices use a blue or a near-UV light emitting diode having a main emission peak in blue wavelength range from 430 nm to 490 nm or in near-UV wavelength range from 380 nm to 420 nm. It is also known to apply a luminescent layer containing inorganic phosphors or quantum dots that absorb blue primary light or near-UV primary light to produce an exciting light having an emission peak in a visible wavelength. The mixture of emitted blue or near-UV light and excited visible wavelength lights produces a white light within ten MacAdam ellipses with at least one point on blackbody locus at 1931 CIE chromaticity diagram.

Almost all the known light emitting semiconductor devices using blue LEDs and phosphors in combination to obtain color-mixed light of the emission light from the blue LEDs and excited light from the phosphors use YAG-based or silicate-based luminescent layers as phosphors. Those solid state lighting devices have typically a white color temperature of about 5000K-8500K with a low color rending index Ra of about 60-70. This white solid state lighting device is not desirable for some applications, like indoor applications, which require warm white color about 2700 k-3500K with a high color rending index Ra above 80.

Known warm white semiconductor light emitting solutions include a multi-color semiconductor dies solution and a single-color semiconductor die with mixed multi-phosphors conversions. Multi-color semiconductor RGB dies that provide a warm white lighting solution have three major issues: 1) Low efficiency due to semiconductor material "green gap"; 2) Low color rendering index due to narrow-band semiconductor light emitting spectrum; and 3) Poor uniformity in RGB spatial separating colors mixing.

Adding amber or red semiconductor emitting light directly to YAG-based or silicate-based phosphor-converted white light can improve the color rendering index with a high luminous efficacy. However, efforts are ongoing to improve the light mixture from multi-color semiconductor light emitters.

A single-color semiconductor die with a multi-colors wavelength conversions solution eliminates the effort for a multi-color mixing mechanism. But multi-colors wavelength conversion limits further improvement of luminous efficacy due to two effects: 1) Backscattering loss from wavelength conversion micro-particles and; 2) Mixed multi-phosphors absorption loss of excited lights.

Known phosphors include TAG, YAG, silicate, and STG based for green-yellow excited light from blue emitted light with peak wavelength from 430 nm-470 nm; silicate, nitrides and sulfides based for orange-red excited light from blue emitted light; and STG based or quantum dots for blue-red excited light from near-UV emitted light with peak wavelength from 380 nm-420 nm. Orange-red phosphor has an excitation spectrum from 350 nm-600 nm. Excited green and yellow is absorbed by the orange-red phosphor in known warm white solutions which use green-orange or yellow-orange mixture phosphors. A warm white LED has about 20-30% lower luminous efficacy than a single yellow phosphor based white LED.

Thus there is a need to overcome the phosphor conversion back-scattering loss and mixed multi-phosphors absorption loss from the known phosphor-converted warm white lighting devices.

There is also a need to improve chromatic uniformity without extra efforts on the light mixing of multi-colors semiconductor emitting lights, However, in view of the prior art taken as a whole at the time the present invention was made, it was not obvious to those of ordinary skill how the identified needs could be fulfilled.

SUMMARY OF THE INVENTION

The long-standing but heretofore unfulfilled need for an apparatus and method for an improved lighting device is now met by a new, useful, and non-obvious invention.

The inventive structure includes a method and a system of providing warm white lighting from a single short wavelength semiconductor die with trichromatic wavelength conversion layers disposed layer by layer in a converting sequence from a long emission spectrum to a short emission spectrum.

At least one wavelength conversion micro-particle is dispersed into a refractive index matched nanoparticle-loaded encapsulant to eliminate backscattering loss into the semiconductor die.

A first embodiment of the invention includes a semiconductor warm white light emitting device (LED) based on a single short wavelength semiconductor die with sequential trichromatic wavelength converting layers. The semiconductor warm white LED includes at least one primary short wavelength light emitting component packaged on a thermal conductive substrate.

The primary semiconductor light emitting component is encapsulated by a nanoparticle-loaded resin layer dispersed with refractive index matched wavelength conversion microparticles to excite a first spectrum of long wavelength excited light. Despite such encapsulation, some primary short wavelength light will leak.

A second wavelength conversion layer is disposed directly on top of the first wavelength conversion encapsulation layer to absorb leaked primary short wavelength light and to excite a second spectrum of excited light having a wavelength shorter than the first spectrum of excited light.

In an alternative embodiment, an air gap may be provided between the second wavelength conversion layer and the first wavelength conversion encapsulation layer. Whether the second wavelength conversion layer is directly deposited on top of the first wavelength conversion layer or spaced therefrom by a gap, some primary short wavelength light will still leak.

A third wavelength conversion layer is disposed appropriately to absorb primary short wavelength light leaked from the first and second wavelength conversion layers and to excite a third spectrum of excited light having a wavelength shorter than both said first and second spectrum of excited light. The combination of the leaked primary light and the excited first, second and third spectrums of light produces a warm white light with correlated color temperature (CCT) in a range of 2700-4000K and a color rendering index of at least 85.

A second embodiment includes a novel solid state lighting device based on a short wavelength semiconductor light emitter array with sequential trichromatic wavelength converting layers.

The solid state warm white lighting device of the second embodiment includes at least one primary short wavelength semiconductor light emitter packaged on a thermally conductive substrate.

The primary semiconductor light emitter is coated by a first wavelength conversion layer having a sufficient number of luminescent micro-particles dispersing into a refractive index matched nanoparticle-loaded solution to absorb the primary light and to excite a first long wavelength spectrum of excited light.

A second wavelength conversion layer is disposed directly on the semiconductor light emitter encapsulation layer to absorb the leaked primary short wavelength light and to excite a second spectrum of excited light having a wavelength shorter than the first spectrum of excited light.

As in the first embodiment, a physical space may be provided between the second wavelength conversion layer of the second embodiment and the first wavelength conversion layer of the second embodiment.

A third wavelength conversion layer is disposed in spaced apart relation to the semiconductor light emitters on an interior surface of the solid state lighting device to absorb the primary short wavelength light leaked from the first and second wavelength conversion layers and to excite a third spectrum of excited light having a wavelength shorter than the first and second spectrums of excited light.

The combination of the leaked primary light and the excited first, second and third spectrums of light produces a warm white light with correlated color temperature (CCT) in a range of 2700-4000K and a color rendering index of at least 85.

An object of the present invention is to suppress phosphor converting back-scattering loss and mixed multi-phosphor absorption loss of known single short wavelength die phosphor-converted (PC) semiconductor lighting devices by utilizing trichromatic wavelength conversion layers disposed layer by layer in a converting sequence from a long emission spectrum to a short emission spectrum to provide a semiconductor warm white light emitting device and a high color reproduction solid state lighting device exhibiting an improved wavelength converting efficiency and a high spatial chromatic uniformity.

These and other important objects, advantages, and features of the invention will become clear as this description proceeds.

The invention accordingly comprises the features of construction, combination of elements, and arrangement of parts that will be exemplified in the description set forth hereinafter and the scope of the invention will be indicated in the claims.

BRIEF DESCRIPTION OF THE DRAWINGS

For a fuller understanding of the nature and objects of the invention, reference should be made to the following detailed description, taken in connection with the accompanying drawings, in which.

DETAILED DESCRIPTION OF THE PREFERRED EMBODIMENT

In a first embodiment, the novel semiconductor warm white light emitting device includes at least one short wavelength semiconductor light emitting component and sequential trichromatic wavelength converting layers.

The semiconductor warm white LED includes at least one primary short wavelength light emitting component packaged on a thermally conductive substrate.

The primary semiconductor light emitting component is encapsulated by a nanoparticle-loaded resin layer dispersed with a refractive index matched wavelength conversion micro-particles to produce a first long wavelength excited light.

A second wavelength conversion layer is disposed directly on top of the first wavelength conversion encapsulation layer to absorb leaked primary short wavelength light and to excite a second spectrum of excited light having a wavelength shorter than the wavelength of the first spectrum of excited light.

An air gap may alternatively be provided between the first and second wavelength conversion layers.

A third wavelength conversion layer is disposed to absorb the primary short wavelength light leaked from the first and second wavelength conversion layers and to excite a third spectrum of excited light having a wavelength shorter than the respective wavelengths of the first and second spectrums of excited light. The combination of the leaked primary light and the excited first, second and third spectrums of light produces a warm white light with correlated color temperature (CCT) in a range of 2700-4000K and a color rendering index of at least 85.

Figure 1:
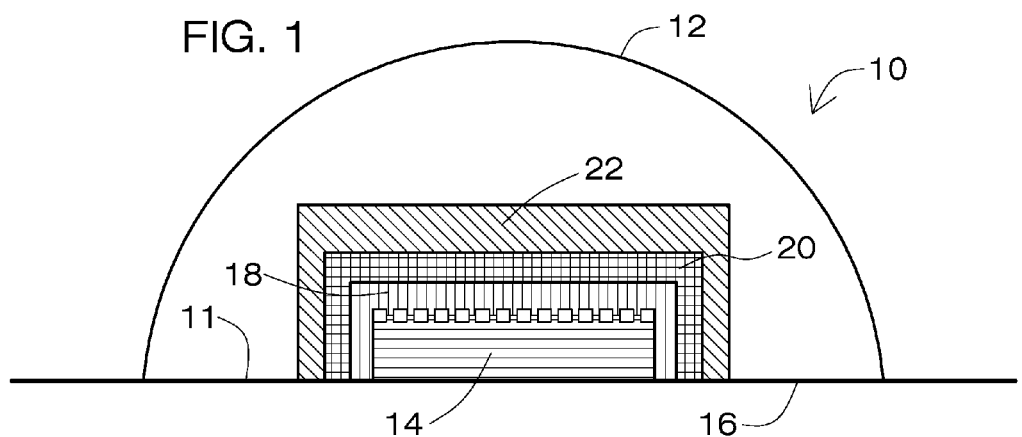
FIG. 1 is a diagrammatic view of a first embodiment of the invention.

FIG. 1 depicts a semiconductor warm white light emitting device (LED) 10 that includes encapsulation dome 12 and at least one primary blue light emitting component 14 packaged on thermally conductive substrate 16.

The primary blue light emitting component 14 is encapsulated by three nanoparticle-loaded resin layers 18, 20, and 22.

A sufficient supply of red or reddish orange luminescent micro-particles is dispersed into inner nanoparticle-loaded resin layer 18, with refractive index matched between the red luminescent micro-particles and the nanoparticle-loaded resin, to absorb primary blue light rays and to excite a first spectrum of red or reddish orange wavelength excited light.

A sufficient number of yellow luminescent micro-particles are dispersed into middle nanoparticle-loaded resin layer 20, with refractive index matched between the yellow luminescent micro-particles and the nanoparticle-loaded resin, to absorb leaked primary blue light rays and to excite a second spectrum of yellow wavelength excited light.

A sufficient number of green luminescent micro-particles are dispersed into outer nanoparticle-loaded resin layer 22, with refractive index matched between the green luminescent micro-particles and the nanoparticle-loaded resin, to absorb leaked primary blue light rays and to excite a third spectrum of green wavelength excited light.

The refractive index match between luminescent micro-particles and the nanoparticle-loaded resin eliminates the backscattering loss into light emitting component 14. The arrangement with longer luminescent material inside the shorter luminescent material eliminates the possibility of longer luminescent material absorbing the converted short wavelength excited light to avoid the photonics energy re-absorption loss.

The combination of leaked primary light and the excited first, second and third spectrums of light produces a warm white light with correlated color temperature (CCT) in a range of 2700-4000K and a color rendering index of at least 85.

The primary short wavelength light emitting component emits a near-UV primary light. The three luminescent materials in order from the inner layer to the outer layer are preferably red, green and blue quantum dots. A yellow luminescent material dispersed into a refractive index matched nanoparticle-loaded resin may be inserted between the red and green wavelength conversion layers for a higher color rendering.

Figure 2:
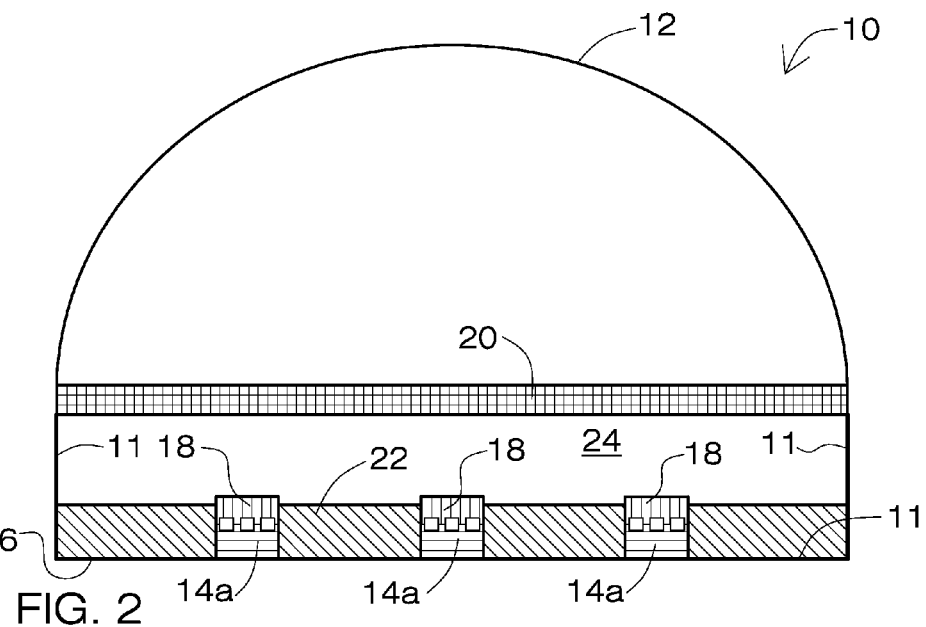
FIG. 2 is a diagrammatic view of a second embodiment.

FIG. 2 depicts a semiconductor warm white light emitting device (LED) including a primary blue light emitting mini-die array, collectively denoted 14a, packaged on a thermally conductive substrate 16.

The primary blue light emitting mini-die array 14a is encapsulated by a nanoparticle-loaded resin layer 18 dispersed with red or reddish orange luminescent micro-particles having a refractive index matched to the resin.

Green wavelength conversion layer 22 is deposited on thermally conductive substrate 16 and around each mini die of the mini-die array.

Yellow wavelength conversion layer 20 is disposed in spaced relation to light emitting mini-die array 14a and green wavelength conversion layer 22.

Primary blue light emitted by mini LEDs 14a is absorbed by the deposited first phosphor layer 18 to excite a first spectrum of reddish orange excited light. The leaked blue light from phosphor layer 18 is absorbed by yellow phosphor layer 20 and excites a second spectrum of yellow light. Some of the primary blue light rays leak from yellow phosphor layer 20 into forward-transferred light, i.e., light that passes through encapsulation dome 12. Some of the primary blue light rays are scattered into back-transferred light and absorbed by green phosphor layer 22 and excite a third spectrum of green light.

The combination of the leaked primary light and the excited first, second and third spectrums of light produces a warm white light with correlated color temperature (CCT) in a range of 2700-4000K and a color rendering index of at least 85.

Thermally conductive substrate 16 may have a reflective coating to recycle the back-transferred or backscattered light. An air gap or optical clear encapsulant 24 may be positioned between yellow phosphor layer 20 and mini-die array 14a.

A third embodiment of the solid state warm white lighting device includes at least one short wavelength semiconductor light emitter and sequential trichromatic wavelength converting layers.

More particularly, the solid state warm white lighting device of the third embodiment includes at least one primary short wavelength semiconductor light emitter packaged on a thermally conductive substrate as in the first two embodiments.

The primary semiconductor light emitter is coated by a first wavelength conversion layer with luminescent micro-particles dispersing into a refractive index matched nanoparticle-loaded solution to absorb primary light and to excite a first long wavelength spectrum of excited light.

A second wavelength conversion layer is disposed directly on the light emitter encapsulation layer or with an air gap between the conversion layer and the light emitter to absorb leaked primary short wavelength light and to excite a second spectrum of excited light having a wavelength shorter than the first spectrum of excited light.

A third wavelength conversion layer is disposed in spaced relation to semiconductor light emitters inside the solid state lighting device to absorb the primary short wavelength light leaked from the first and second wavelength conversion layers and to excite a third spectrum of excited light having a wavelength shorter than the first and second spectrums of excited light.

The combination of the leaked primary light and the excited first, second and third spectrums of light produces a warm white light with correlated color temperature (CCT) in a range of 2700-4000K and a color rendering index of at least 85.

Figure 3:
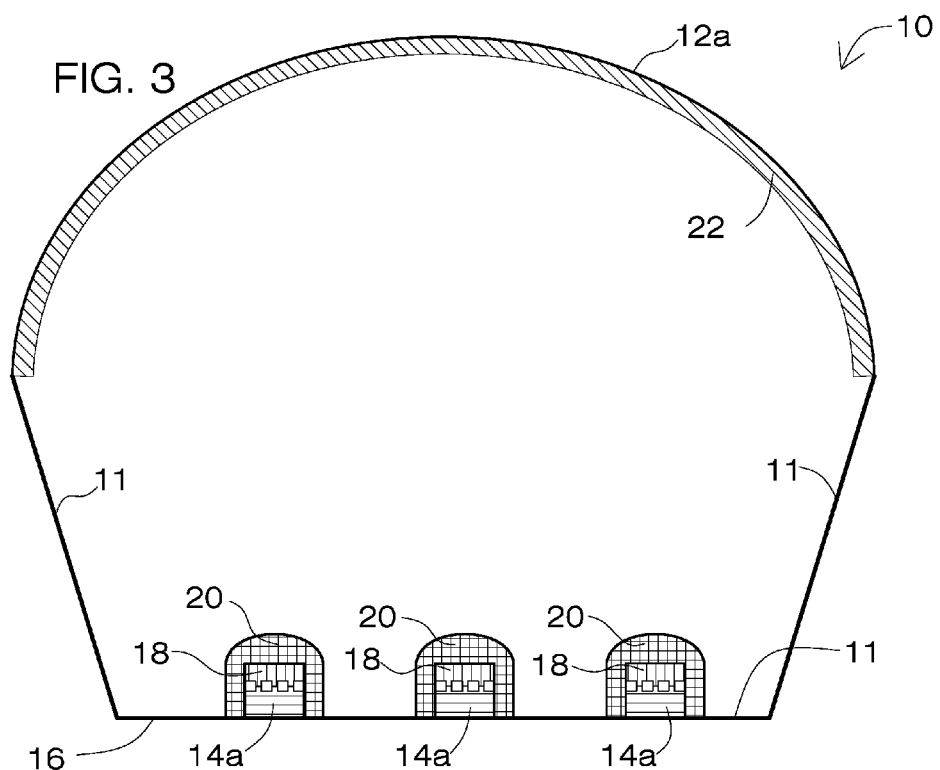
FIG. 3 is a diagrammatic view of a third embodiment.

An example of the third embodiment is depicted in FIG. 3. Solid state warm white lighting device 10 includes at least one primary blue semiconductor light emitter 14 packaged on a thermal conductive substrate 16.

Each primary semiconductor blue light emitter 14 is coated with a reddish orange phosphor wavelength conversion layer 18 with luminescent micro-particles dispersing into a refractive index matched nanoparticle-loaded solution to absorb primary blue light and to excite a first spectrum of reddish orange excited light.

The at least one blue light emitter 14 is further encapsulated by a nanoparticle-loaded resin layer 20 on top of reddish orange phosphor conversion layer 18. A sufficient number of yellow luminescent micro-particles are dispersed into the refractive index matched resin to absorb leaked primary blue light and convert it into a second spectrum of yellow excited light.

A green wavelength conversion layer 22 is coated on an interior surface of output window 12a of solid state lighting device 10 to absorb some of the leakage of the primary blue light and convert it into a third spectrum of green excited light.

Green wavelength conversion layer 22 may include a nanoparticle-loaded resin having a matched refractive index to eliminate backscattering loss. Solid state lighting device output window 12a may be a diffuser and said output window may have a dome shape.

Figure 4:
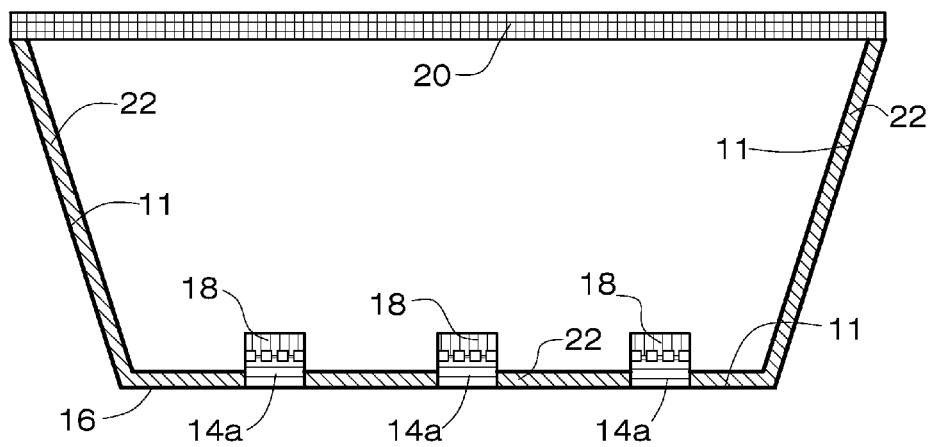
FIG. 4 is a diagrammatic view of a fourth embodiment.

FIG. 4 depicts a fourth embodiment of the novel solid state warm white lighting device 10 that includes at least one primary blue semiconductor light emitter 14 packaged on a thermally conductive reflective substrate 16 on an interior surface of reflective wall 11 of solid state lighting device 10.

Each primary semiconductor blue light emitter 14 is coated by a reddish orange phosphor conversion layer 18 having luminescent micro-particles dispersing into a refractive index matched nanoparticle-loaded solution to absorb primary blue light and to excite a first spectrum of reddish orange excited light.

Yellow wavelength conversion layer 22 is coated on an interior surface of output window 12a of solid state lighting device 10 to absorb leaked primary blue light and to convert it into a second spectrum of yellow excited light. Some of the primary blue light is still leaked into a forward-transferred light that exits device 10 through output window 12a and some of primary blue light is scattered into a back-transferred light.

Green wavelength conversion layer 22 is deposited on reflective walls 11 and on substrate 16 around blue light emitters 14 to absorb the back-transferred primary blue light and to convert it into a third spectrum of green excited light. Reflective walls 11 recycle the backscattered light.

The combination of the leaked primary light and the excited first, second and third spectrums of light produces a warm white light with correlated color temperature (CCT) in a range of 2700-4000K and a color rendering index of at least 85.

It will thus be seen that the objects set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention that, as a matter of language, might be said to fall therebetween.

What is claimed is:

1. A semiconductor warm white light emitting device, comprising:
   at least one short wavelength semiconductor light emitting component;
   a plurality of trichromatic wavelength converting layers arranged in a predetermined sequence so that light emitted by said at least one short wavelength semiconductor light emitting component must pass through said trichromatic wavelength converting layers prior to exiting said device;
   said at least one primary short wavelength light emitting component being packaged on a thermally conductive substrate;
   said at least one short wavelength light emitting component being encapsulated by a first wavelength conversion layer; and
   said first wavelength conversion layer including a nanoparticle-loaded resin layer dispersed with refractive index matched wavelength conversion micro-particles, thereby creating a first wavelength spectrum of excited light.

2. The device of claim 1, further comprising:
   a second wavelength conversion layer disposed in overlying relation to the first wavelength conversion layer to absorb leaked primary short wavelength light and to excite a second spectrum of excited light having a wavelength shorter than the wavelength of the first spectrum of excited light;
   said second wavelength conversion layer including a second nanoparticle-loaded resin layer that includes wavelength conversion micro-particles having refractive indices that match refractive indices of said nanoparticles in said second nanoparticle-loaded resin layer.

3. The device of claim 2, further comprising:
   said overlying relation including physical contact of said second wavelength conversion layer and said first wavelength conversion layer.

4. The device of claim 2, further comprising:
   said overlying relation including a physical gap between said second wavelength conversion layer and said first wavelength conversion encapsulation layer.

5. The device of claim 2, further comprising:
   a third wavelength conversion layer disposed in overlying relation to said second wavelength conversion layer to absorb primary short wavelength light leaked from said first and second wavelength conversion layers and to excite a third spectrum of excited light having a wavelength shorter than respective wavelengths of said first and second spectrums of excited light;
   said third wavelength conversion layer including a third nanoparticle-loaded resin layer that includes wavelength conversion micro-particles having refractive indices that match refractive indices of said nanoparticles in said third nanoparticle-loaded resin layer;
   whereby combination of leaked primary light and the excited first, second and third spectrums of light produces a warm white light with correlated color temperature (CCT) in a range of 2700-4000K and a color rendering index of at least 85.

6. The device of claim 5, further comprising:
   said at least one short wavelength semiconductor light emitting component being a blue light emitting component;
   said first wavelength conversion layer including a sufficient supply of red or reddish orange luminescent micro-particles dispersed into said first nanoparticle loaded resin layer;
   said second wavelength conversion layer including a sufficient supply of yellow luminescent micro-particles dispersed into said second nanoparticle loaded resin layer; and
   said third wavelength conversion layer including a sufficient supply of green luminescent micro-particles dispersed into said third nanoparticle loaded resin layer.

* * * * *